United States Patent
Loopstra et al.

(10) Patent No.: US 9,134,629 B2
(45) Date of Patent: Sep. 15, 2015

(54) ILLUMINATION SYSTEM, LITHOGRAPHIC APPARATUS AND METHOD OF FORMING AN ILLUMINATION MODE

(75) Inventors: Erik Roelof Loopstra, Eindhoven (NL); Koen Van Ingen Schenau, Veldhoven (NL); Jan Bernard Plechelmus Van Schoot, Eindhoven (NL); Christian Wagner, Duizel (NL); Gosse Charles De Vries, Veldhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 1044 days.

(21) Appl. No.: 13/203,773

(22) PCT Filed: Feb. 25, 2010

(86) PCT No.: PCT/EP2010/052432
§ 371 (c)(1),
(2), (4) Date: Aug. 29, 2011

(87) PCT Pub. No.: WO2010/100078
PCT Pub. Date: Sep. 10, 2010

(65) Prior Publication Data
US 2012/0013882 A1 Jan. 19, 2012

Related U.S. Application Data

(60) Provisional application No. 61/157,498, filed on Mar. 4, 2009.

(51) Int. Cl.
*G03F 7/20* (2006.01)

(52) U.S. Cl.
CPC ........ *G03F 7/70825* (2013.01); *G03F 7/70075* (2013.01); *G03F 7/70116* (2013.01)

(58) Field of Classification Search
CPC ............ G03F 7/70075; G03F 7/70116; G03F 7/70825
USPC ...................................................... 355/67, 71
See application file for complete search history.

(56) References Cited

U.S. PATENT DOCUMENTS 7,384,725 B2  6/2008  Minvielle et al.
7,830,578 B2 * 11/2010  Branson et al. ............... 359/238

(Continued)

FOREIGN PATENT DOCUMENTS

CN  1790169  6/2006
CN  1947063  4/2007

(Continued)

OTHER PUBLICATIONS

International Search Report for PCT International Patent Application No. PCT/EP2010/052432, mailed Jun. 25, 2010.

*Primary Examiner* — Deoram Persaud
(74) *Attorney, Agent, or Firm* — Pillsbury Winthrop Shaw Pittman LLP

(57) ABSTRACT

An illumination system of a lithographic apparatus includes a plurality of reflective elements arranged to receive radiation from a radiation source, the reflective elements being movable between different orientations. In the different orientations, the reflective elements direct radiation towards different locations at a reflective component in a pupil plane of the illumination system, thereby forming different illumination modes. Each reflective element is moveable between a first orientation, which directs radiation towards a first location the pupil plane, and a second orientation, which directs radiation towards a second location in the pupil plane. The first orientation and the second orientation of the reflective element are defined by end stops.

24 Claims, 15 Drawing Sheets

(56) References Cited

U.S. PATENT DOCUMENTS

| | | |
|---|---|---|
| 8,237,913 B2 * | 8/2012 | Kazinczi et al. ............... 355/52 |
| 2002/0075468 A1 | 6/2002 | Antoni |
| 2004/0101018 A1 * | 5/2004 | Leijenaar et al. ............ 372/107 |
| 2005/0002005 A1 * | 1/2005 | Terada et al. ................. 355/53 |
| 2005/0219497 A1 * | 10/2005 | Bleeker ......................... 355/69 |
| 2005/0221233 A1 | 10/2005 | Minvielle et al. |
| 2006/0175556 A1 * | 8/2006 | Yabuki ...................... 250/492.1 |
| 2007/0007849 A1 * | 1/2007 | Ogikubo et al. ............. 310/309 |
| 2007/0024951 A1 * | 2/2007 | Mochizuki et al. .......... 359/291 |
| 2007/0177123 A1 | 8/2007 | Tel et al. |
| 2012/0147345 A1 * | 6/2012 | Buis et al. ...................... 355/66 |
| 2012/0154777 A1 * | 6/2012 | De Vries et al. ............... 355/71 |
| 2012/0262689 A1 * | 10/2012 | Van Ingen Schenau et al. ............................. 355/67 |
| 2012/0262690 A1 * | 10/2012 | De Boeij et al. ............... 355/67 |

FOREIGN PATENT DOCUMENTS

| | | |
|---|---|---|
| EP | 1262836 A1 | 12/2002 |
| EP | 1672431 A1 | 6/2006 |

* cited by examiner

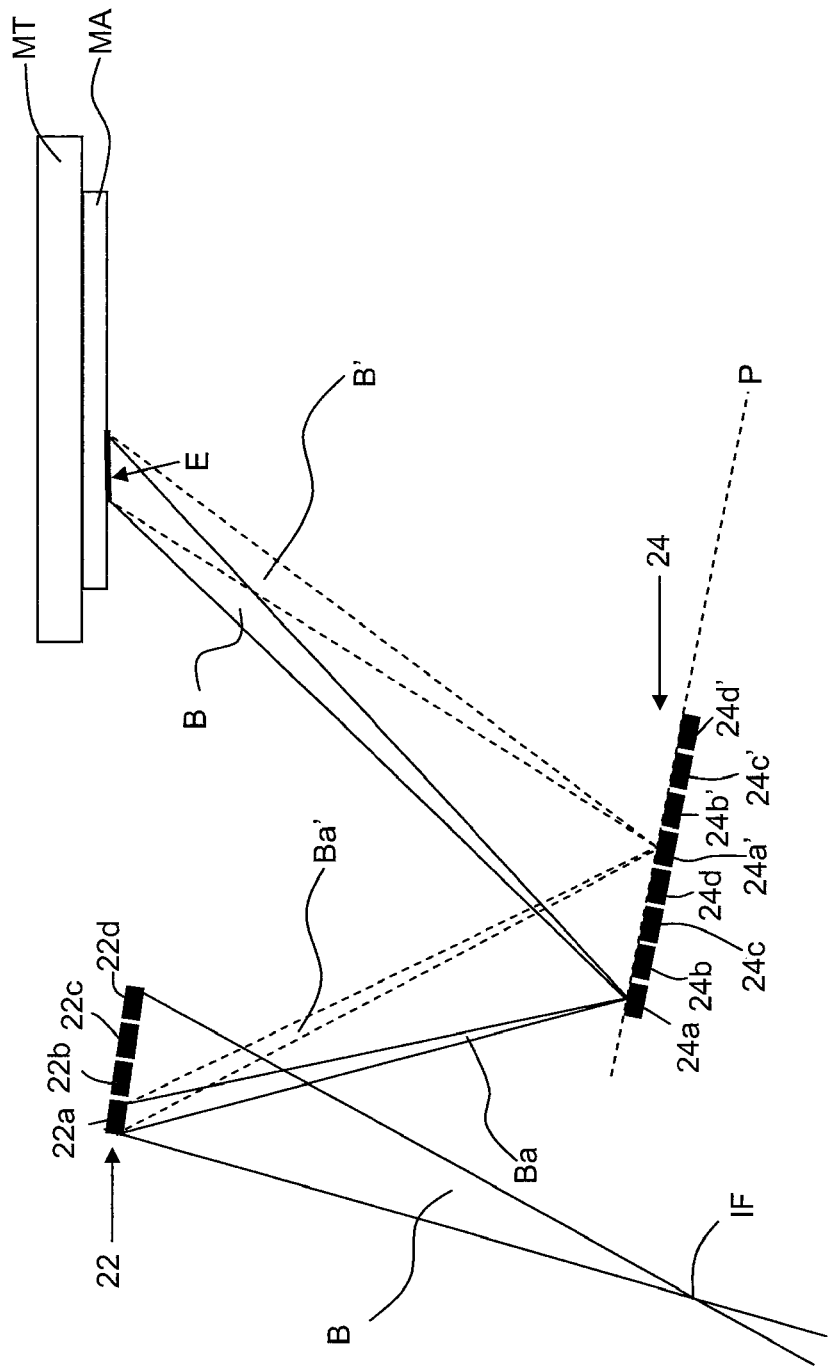

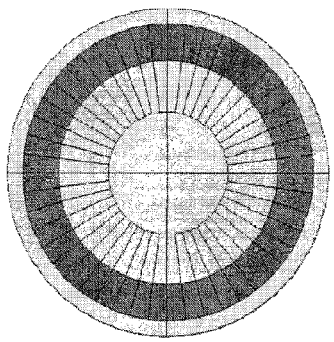 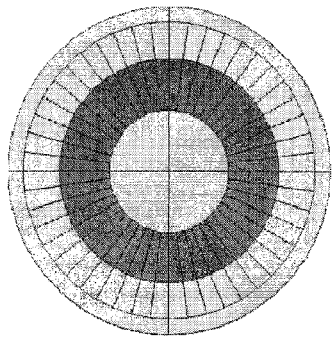 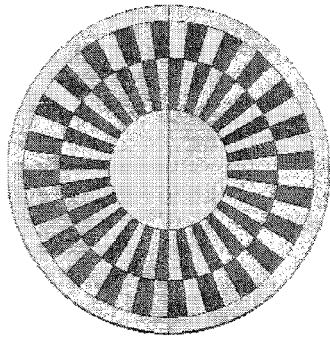
Figure 11a        Figure 11b        Figure 11c
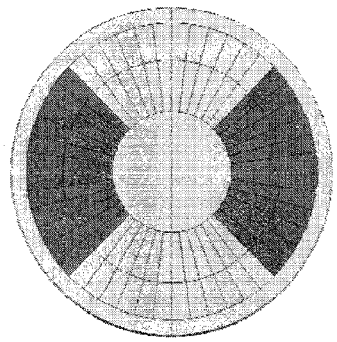 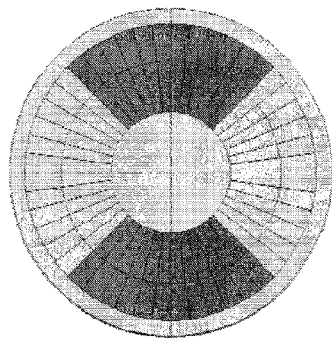
Figure 11d        Figure 11e
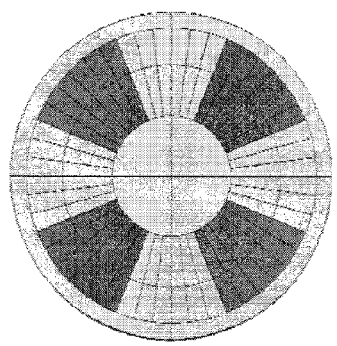 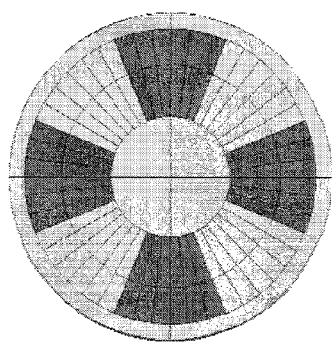
Figure 11f        Figure 11g

ILLUMINATION SYSTEM, LITHOGRAPHIC APPARATUS AND METHOD OF FORMING AN ILLUMINATION MODE

CROSS-REFERENCE TO RELATED APPLICATIONS

This application is the national stage entry of International Patent Application No. PCT/EP2010/052432, filed Feb. 25, 2010, which claims the benefit of priority from U.S. Provisional Patent Application No. 61/157,498, filed Mar. 4, 2009, the content of which is incorporated by reference in its entirety.

FIELD

The present invention relates to an illumination system, a lithographic apparatus including the illumination system, and a method of forming an illumination mode.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC. This pattern can be transferred onto a target portion (e.g. comprising part of a die, one die, or several dies) on a substrate (e.g. a silicon wafer) Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through the beam in a given direction (the "scanning"-direction) while synchronously scanning the substrate parallel or anti-parallel to this direction.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A lithographic apparatus generally includes an illumination system. The illumination system receives radiation from a source, for example an excimer laser or an extreme ultra violet radiation source, and provides a radiation beam (sometimes referred to as a "projection" beam) which is incident upon a patterning device. The radiation beam is patterned by the patterning device, and is then projected by a projection system onto a substrate.

It is known in the art of lithography that an image of the patterning device projected onto a substrate can be improved by providing the radiation beam with an appropriate illumination mode. An illumination mode is a spatial intensity distribution of the radiation beam in a pupil plane of the illumination system, centred with respect to an axis or optical axis of the illumination system. At the plane of the patterning device (a field plane of the illumination system) such a spatial intensity distribution corresponds to a distribution of angles of incidence of incident radiation, referred to as an angular intensity distribution of radiation. A desired illumination mode may, for example, be a conventional illumination mode having a central irradiated portion in the pupil plane or an off axis illumination mode having one or more isolated, off axis irradiated portions in the pupil plane. Accordingly, an illumination system of a lithographic apparatus typically includes an intensity distribution adjustment apparatus arranged to direct, shape and control the radiation beam in the illumination system such that a selected illumination mode can be achieved.

The prior art describes various intensity distribution adjustment apparatus arranged to control the illumination beam so as to achieve a desired illumination mode. For example, a zoom-axicon device (a combination of a zoom lens and an axicon) can be used to create an annular illumination mode, whereby the inner and outer radii of the annular intensity distribution in the pupil plane are controllable. The magnitude of the inner and outer radii is usually indicated by $\sigma_{inner}$ and $\sigma_{outer}$ respectively. These numbers represent respectively the ratio of the inner radius and the ration of the outer radius to the radius corresponding to the numerical aperture of the projection system. A zoom-axicon device generally comprises multiple refractive optical components that are independently movable. A zoom-axicon device is therefore not suitable for use with EUV radiation (e.g. radiation at 13.5 nm or with a wavelength between 5 and 20 nm), because radiation at these wavelengths is strongly absorbed as it passes through refractive materials.

Spatial filters may be used to create illumination modes. For example, a spatial filter with two opposite, off axis openings corresponding to a dipole illumination mode may be provided in a pupil plane of the illumination system in order to generate a dipole illumination mode. The spatial filter may be removed and replaced by a different spatial filter when a different illumination mode is required. However, spatial filters block a considerable proportion of the radiation beam, thereby reducing the intensity of the radiation beam when it is incident upon the patterning device. Known EUV sources struggle to provide EUV radiation at an intensity which is sufficient to allow a lithographic apparatus to operate efficiently. Therefore, it is not desirable to block a considerable portion of the radiation beam when forming the illumination mode.

SUMMARY

It is desirable to provide a lithographic apparatus which overcomes or mitigates one or more shortcomings of the apparatus described above.

According to a first aspect of the invention there is provided an illumination system having a plurality of reflective elements, the reflective elements being movable between different orientations which direct radiation towards different locations in a pupil plane, thereby forming different illumination modes, wherein each reflective element is moveable between a respective first orientation which directs radiation towards a first associated location at the pupil plane and a respective second orientation which directs radiation towards a second associated location at the pupil plane, the respective first orientation and the respective second orientation of the reflective element being defined by end stops.

According to an aspect of the invention there is provided a lithographic apparatus comprising an illumination system having a plurality of reflective elements, the reflective elements being movable between different orientations which direct radiation towards different locations in a pupil plane, thereby forming different illumination modes, wherein each reflective element is moveable between a respective first orientation which directs radiation towards a first associated location at the pupil plane and a respective second orientation which directs radiation towards a second associated location at the pupil plane, the respective first orientation and the respective second orientation of the reflective element being defined by end stops.

According to an aspect of the invention there is provided a method of forming illumination modes in an illumination system, the method comprising moving a plurality of reflective elements to respective first orientations which are defined by end stops, directing radiation at associated first locations at a pupil plane to form a first illumination mode, then moving at least some of the plurality of reflective elements to respective second orientations which are defined by end stops, and directing radiation at associated second locations at a pupil plane to form a second illumination mode.

According to an aspect of the invention there is provided an illumination system including a first and second reflective component, the first reflective component constructed and arranged to receive radiation from a radiation source and to reflect the radiation towards a second reflective component, the second reflective component constructed and arranged to function as a secondary radiation source by reflecting incident radiation towards an illumination area for a patterning device, the first reflective component having a plurality of primary reflective elements, wherein each primary reflective element is movable between a respective first orientation in which radiation is reflected towards a first associated location at the second reflective component, and a respective second orientation in which radiation is reflected towards a second associated location at the second reflective component, the first orientation and the second orientation of the reflective element being defined by end stops.

According to an aspect of the invention there is provided a lithographic apparatus comprising an illumination system including a first and second reflective component, the first reflective component constructed and arranged to receive radiation from a radiation source and to reflect the radiation towards a second reflective component, the second reflective component constructed and arranged to function as a secondary radiation source by reflecting incident radiation towards an illumination area for a patterning device, the first reflective component having a plurality of primary reflective elements, wherein each primary reflective element is movable between a respective first orientation in which radiation is reflected towards a first associated location at the second reflective component, and a respective second orientation in which radiation is reflected towards a second associated location at the second reflective component, the first orientation and the second orientation of the reflective element being defined by end stops.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3 and 4 illustrate operation of moveable reflective elements of an illumination system of the lithographic apparatus;

FIG. 11 depicts seven illumination modes obtainable using the alternative embodiment of the invention.

DETAILED DESCRIPTION

Figure 1:
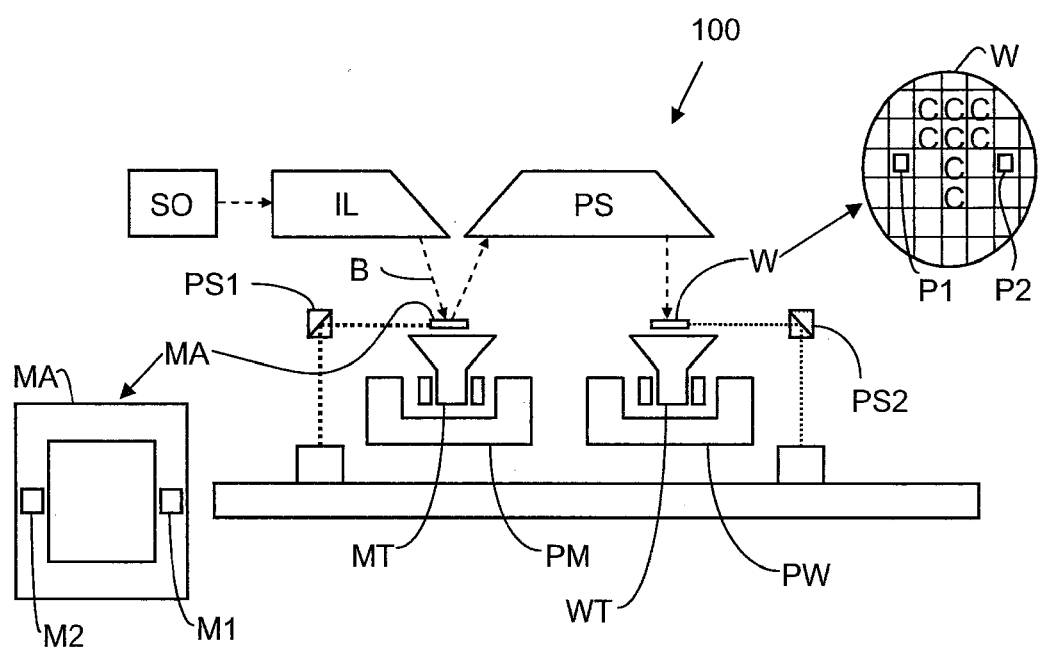
FIG. 1 schematically depicts a lithographic apparatus according to an embodiment of the invention.

FIG. 1 schematically depicts a lithographic apparatus 100 including a source collector module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the afore mentioned outer and/or inner radial extent (with values $\sigma_{outer}$ and $\sigma_{inner}$ respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired intensity uniformity and angular intensity distribution in its cross-section, as incident on the patterning device.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure).

The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, the illumination system IL comprises an intensity distribution adjustment apparatus. The intensity distribution adjustment apparatus is arranged to adjust the spatial intensity distribution of the radiation beam at a pupil plane in the illumination system, in order to control the angular intensity distribution of the radiation beam incident on the patterning device. The intensity distribution adjustment apparatus may be used to select different illumination modes at the pupil plane of the illumination system. Selection of an illumination mode may for example depend upon properties of a pattern which is to be projected from the patterning device MA onto the substrate W. The spatial intensity distribution of the radiation beam at the illumination system pupil plane is converted to an angular intensity distribution before the radiation beam is incident upon the patterning device (e.g. mask) MA. It is appreciated that there is a Fourier relationship between the pupil plane of the illumination system and the patterning device MA (the patterning device is in a field plane). The pupil plane of the illumination system is a Fourier transform plane of the object plane where the patterning device MA is located, and it is conjugate to a pupil plane of the projection system.

Figure 2A:
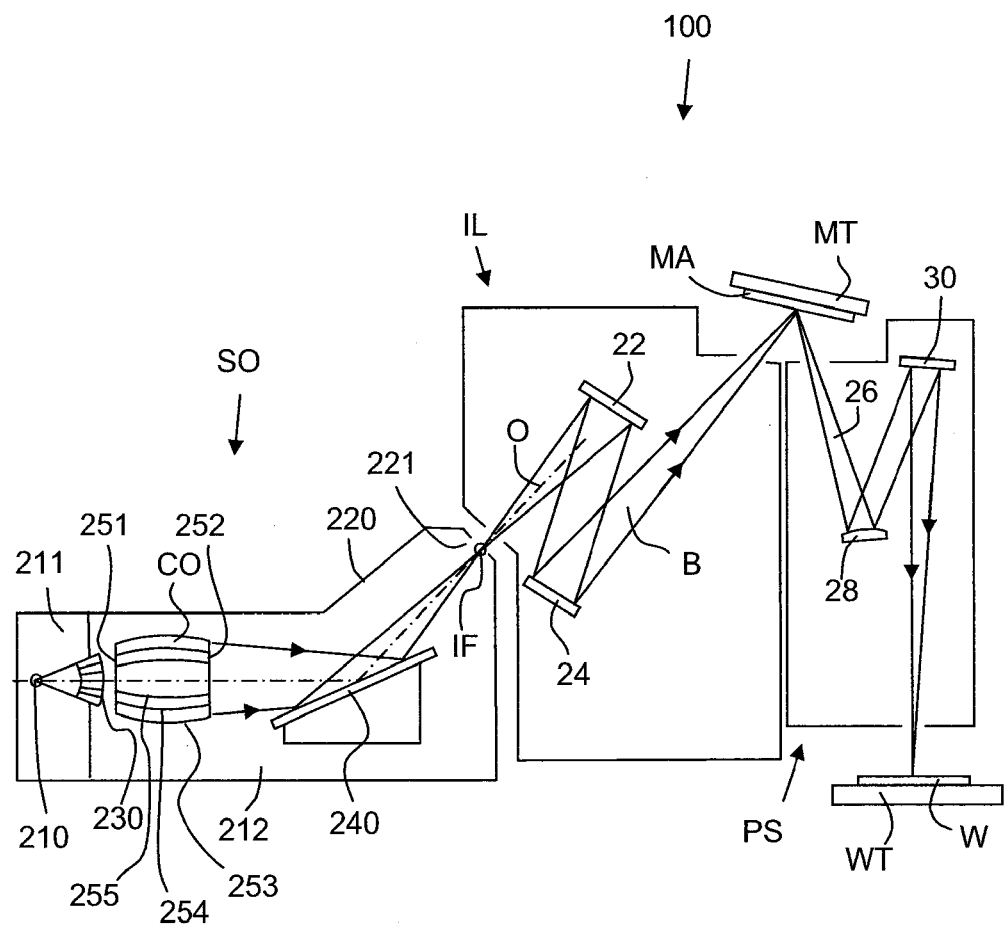
FIG. 2a schematically depicts part of the lithographic apparatus of FIG. 1 in more detail including a discharge produced plasma source.

FIG. 2a shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22, also referred to hereinafter as the first reflective component 22, and a facetted pupil mirror device 24, also referred to hereinafter as the second reflective component 24, arranged to provide a desired angular distribution of the radiation beam B, at the patterning device MA, as well as a desired uniformity of radiation intensity at the patterning device MA. Upon reflection of the beam of radiation B at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2a.

Collector optic CO, as illustrated in FIG. 2a, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 2B:
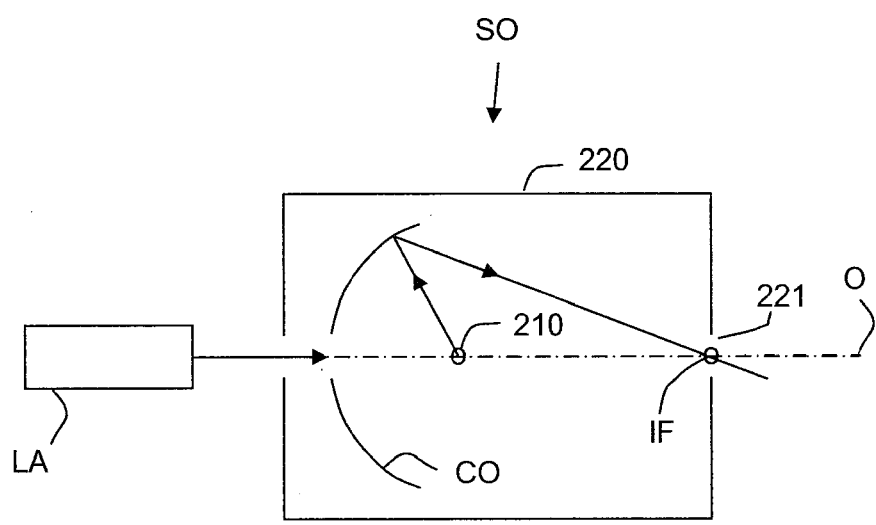
FIG. 2b schematically depicts part of the lithographic apparatus of FIG. 1 in more detail including a laser produced plasma source.

Alternatively, the source collector module SO may be part of an LPP radiation system as shown in FIG. 2b. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

Figure 3:
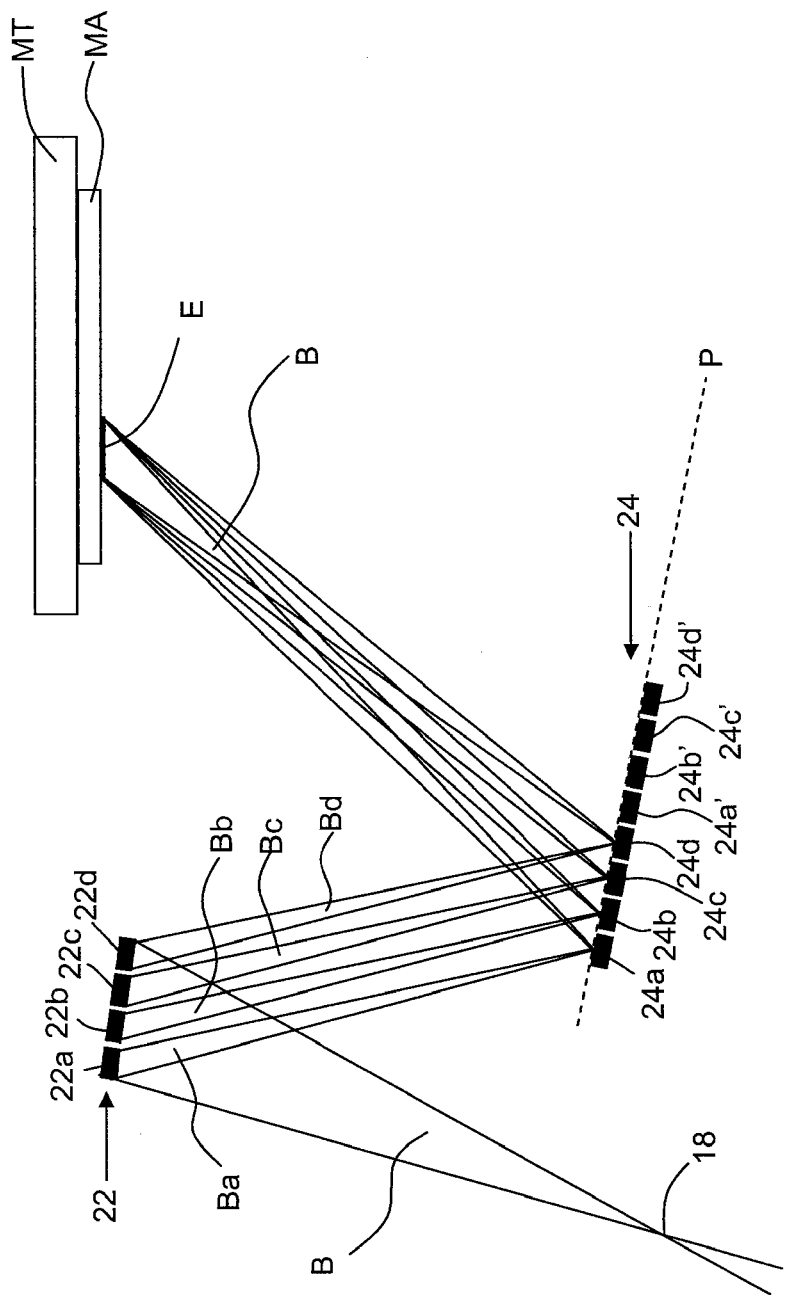

FIG. 3 schematically shows part of the lithographic apparatus, including the first and second reflective components in more detail. The first reflective component 22 comprises a plurality of primary reflective elements including the primary reflective elements 22a, 22b, 22c and 22d. The second reflective component 24 comprises a plurality of secondary reflective elements including the secondary reflective elements 24a, 24b, 24c, 24d, and 24a', 24b', 24c', 24d'. Primary and secondary reflective elements may, hereinafter, also be referred to as field facet mirrors and pupil facet mirrors, respectively. The primary reflective elements 22a-d are configured to direct (reflect) radiation towards the secondary reflective elements 24a-d,a'-d'. Although only four primary reflective elements 22a-d are shown, any number of primary reflective elements may be provided. The primary reflective elements may be arranged in a two-dimensional array (or some other two-dimensional arrangement). Although only eight secondary reflective elements 24a-d,a'-d' are shown, any number of secondary reflective elements (the number being typically a multiple of the number of primary reflective elements) may be provided. The secondary reflective elements may be arranged in a two-dimensional array (or some other two-dimensional arrangement).

The primary reflective elements 22a-d have adjustable orientations, and may be used to direct radiation towards selected secondary reflective elements 24a-d,a'-d'.

The second reflective component 24 coincides with a pupil plane P of the illumination system IL or is disposed proximate to a pupil plane of the illumination system. The second reflective 24 component therefore acts as a virtual radiation source (also commonly referred to as a secondary radiation source) which directs radiation onto the patterning device MA. A further mirror (not shown) may be provided between the second reflective component 24 and the patterning device MA. The latter mirror may be a system of mirrors, and may be arranged to image the primary reflective elements 22a-d onto the plane wherein in use the patterning device MA is held by the substrate table MT.

The spatial intensity distribution of the radiation beam B at the second reflective component 24 defines the illumination mode of the radiation beam. Since the primary reflective elements 22a-d have adjustable orientations, they may be used to form different spatial intensity distributions at the pupil plane P, thereby providing different illumination modes.

In use, the radiation beam B is incident upon the primary reflective elements 22a-d of the first reflective component 22. Each primary reflective element 22a-d reflects a sub-beam of radiation towards a different, secondary reflective element 24a-d,a'-d' of the second reflective component 24. A first sub-beam Ba is directed by a first primary reflective element 22a to a first secondary reflective element 24a. Second, third and fourth sub-beams Bb, Bc and Bd are directed by second, third and fourth primary reflective elements 22b, 22c, and 22d respectively to second, third and fourth secondary reflective elements 24b, 24c, and 24d.

The sub-beams Ba-d are reflected by the secondary reflective elements 24a-d towards the patterning device MA. The sub-beams may together be considered to form a single radiation beam B which illuminates an illumination area E on the mask MA. The shape of the illumination area E is determined by the shape of the primary reflective elements 22a-d. In a scanning lithographic apparatus the illumination area E may for example be a rectangle or a curved band, which in the scanning direction has a width narrower than the width in a direction perpendicular to the scanning direction.

Each of the primary reflective elements 22a-d forms an image of the intermediate focus IF at a different secondary reflective element 24a-d,a'-d' of the second reflective component 24. In practice, the intermediate focus IF will be an image of the plasma source, the image having a finite diameter (e.g. 4-6 mm). Consequently, each primary reflective element 22a-d will form an image of the virtual source point IF which has a finite diameter (e.g. 3-5 mm) at the secondary reflective elements 24a-d,a'-d'. The secondary reflective elements 24a-d,a'-d' may each be arranged and constructed as a single pupil facet mirror having a diameter which is larger than the afore mentioned image diameter (to avoid radiation falling between secondary reflective elements and thereby being lost). The intermediate focus IF and images of the intermediate focus IF are shown as points in the figures for ease of illustration.

The primary reflective elements and the secondary reflective elements may have optical powers different from zero. For example, each primary reflective element 22a-d may form at or near an irradiated secondary reflective element a demagnified image of the virtual source point IF which is smaller than the virtual source point IF. Each one of the secondary reflective elements 24a-d,a'-d' may form an image of one of the primary reflective element 22a-d at or near the field plane wherein the patterning device is located during exposure of a substrate. These images are substantially overlapping and together form the illumination area E.

The orientation of the primary reflective elements 22a-d determines the illumination mode which is formed at the pupil plane P. For example, the primary reflective elements 22a-d may be oriented such that radiation sub-beams are directed at the four innermost secondary reflective elements 24c,d,a',b'. This would provide an illumination mode which could be considered to be a one-dimensional equivalent of a conventional (disk-shaped) illumination mode. Such a conventional illumination mode is characterized by an intensity distribution in the pupil plane having a portion with relatively high intensity which is centred at the optical axis O, surrounded by a portion of relatively low or even zero intensity, and may therefore be referred to, hereinafter, as a conventional "on axis" illumination mode. In an alternative example, the primary reflective elements 22a-d may be oriented such that radiation sub-beams are directed at two secondary reflective elements 24a-b at a left hand end of the second reflective component 24, and at two secondary reflective components 24c'-d' at a right hand end of the second reflective component. This would provide an illumination mode which could be considered to be a one-dimensional equivalent of, for example, an annular illumination mode. Such an illumination mode is characterized by an intensity distribution in the pupil plane having a portion with relatively low or even zero intensity which is centred at the optical axis O, surrounded by an area having at least one portion of relatively high intensity, and may therefore be referred to, hereinafter, as an "off axis" illumination mode.

Each of the primary reflective elements such as anyone of the elements 22a-d is configured such that it may be in one of two predetermined orientations: a first orientation and a second orientation. The first orientation is such that the primary reflective element reflects a sub-beam of radiation towards a selected secondary reflective element comprised within a first desired location on the second reflective component 24. The second orientation is such that the primary reflective element reflects the sub-beam of radiation towards a selected secondary reflective element comprised within a second desired location on the second reflective component 24. Further, each of the primary reflective elements such as any one of the field facets 22a-d illustrated in FIG. 3 is moveable between its associated first orientation and second orientation.

To indicate that a field facet mirror in its first orientation irradiates, in use, a particular pre-selected secondary reflective element which is specifically selected from the plurality of secondary reflective elements, reference is made hereinafter to a first "associated" secondary reflective element. Similarly, reference is made to the second "associated" secondary reflective element, it being the element irradiated when the field facet mirror is in its second orientation. Similarly, afore mentioned first and second desired locations are also referred to, hereinafter as the first and second "associated" locations.

FIG. 4 illustrates the movement of a primary reflective element between first and second orientations, using as an example the first primary reflective element 22a of the first reflective component 22. When the first primary reflective element 22a is in a first orientation, it directs a radiation sub-beam Ba towards a first secondary reflective 24a of the second reflective component 24. When the first primary reflective element 22a is in a second orientation, it directs a radiation sub-beam Ba' (shown with dotted lines) towards a second secondary reflective 24a' of the second reflective component 24. The corresponding first and second locations are not shown explicitly in FIG. 4. In FIG. 4 the first and second locations may be assumed to coincide with the locations occupied by the first and second secondary reflective elements 24a and 24a' respectively. However, the first and second locations may be separate areas in the pupil plane P, and may each include a plurality of secondary reflective elements, as will be discussed in detail further below.

Each primary reflective element of a group of primary reflective elements such as the group of elements 22a-d may be arranged to direct a radiation sub-beam to a first location and a second location associated with each primary reflective element 22a-d, the first and second location being different and unique with respect to locations which receive radiation sub-beams from other primary reflective elements not belonging to the said group of primary reflective elements such as the group of elements 22a-d. By configuring each primary reflective element 22a-d appropriately, radiation may be directed towards the requisite locations at the second reflective component 24 so as to produce spatial intensity distributions which correspond with desired illumination modes.

Although FIGS. 3 and 4 show only four primary reflective elements 22a-d, the first reflective component 22 may comprise many more primary reflective elements. The first reflective component 22 may comprise for example up to 100, up to 200 or up to 400 primary reflective elements. The first reflective component 22 may comprise for example any number in the range of 100-800 primary reflective elements. The reflective elements may be mirrors. The first reflective component 22 may comprise an array of 1024 (e.g. 32×32) mirrors, or 4096 (e.g. 64×64) mirrors, or any suitable number of mirrors. The primary reflective elements may be arranged in a two-dimensional grid-like formation. The primary reflective elements may be arranged in a plane which crosses through the radiation beam.

The first reflective component 22 may comprise one or more arrays of primary reflective elements. For example, the primary reflective elements may be arranged or grouped to form a plurality of arrays, each array for example having 32×32 mirrors. In the text, the term "array" may mean a single array or a group of arrays.

The secondary reflective elements 24a-d,a'-d' may be mounted such that the orientations of the secondary reflective elements are fixed with respect to a mounting surface of the second reflective component.

Figure 5A:
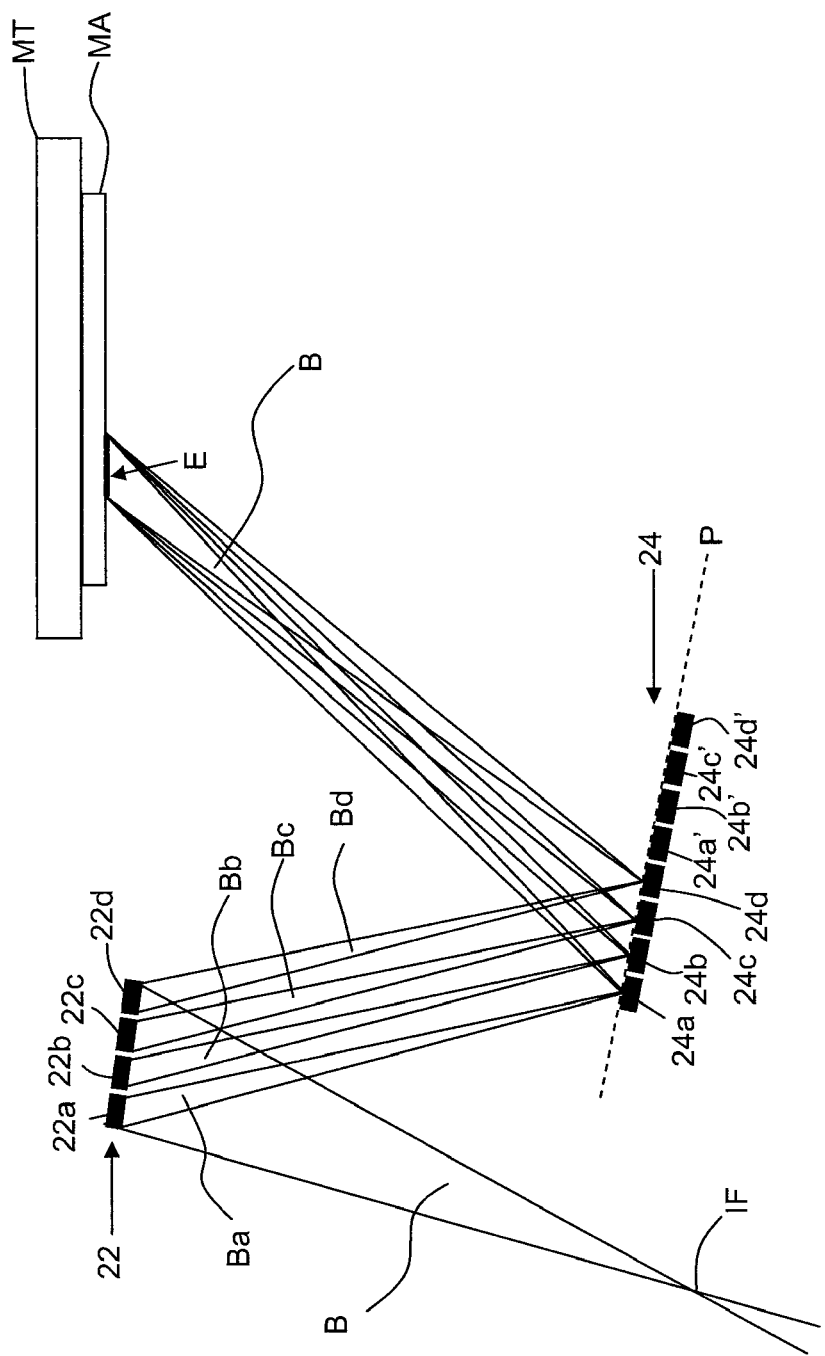
FIGS. 5 and 6 illustrate operation of moveable reflective elements of an illumination system of the lithographic apparatus, and resulting illumination modes.
Figure 5B:
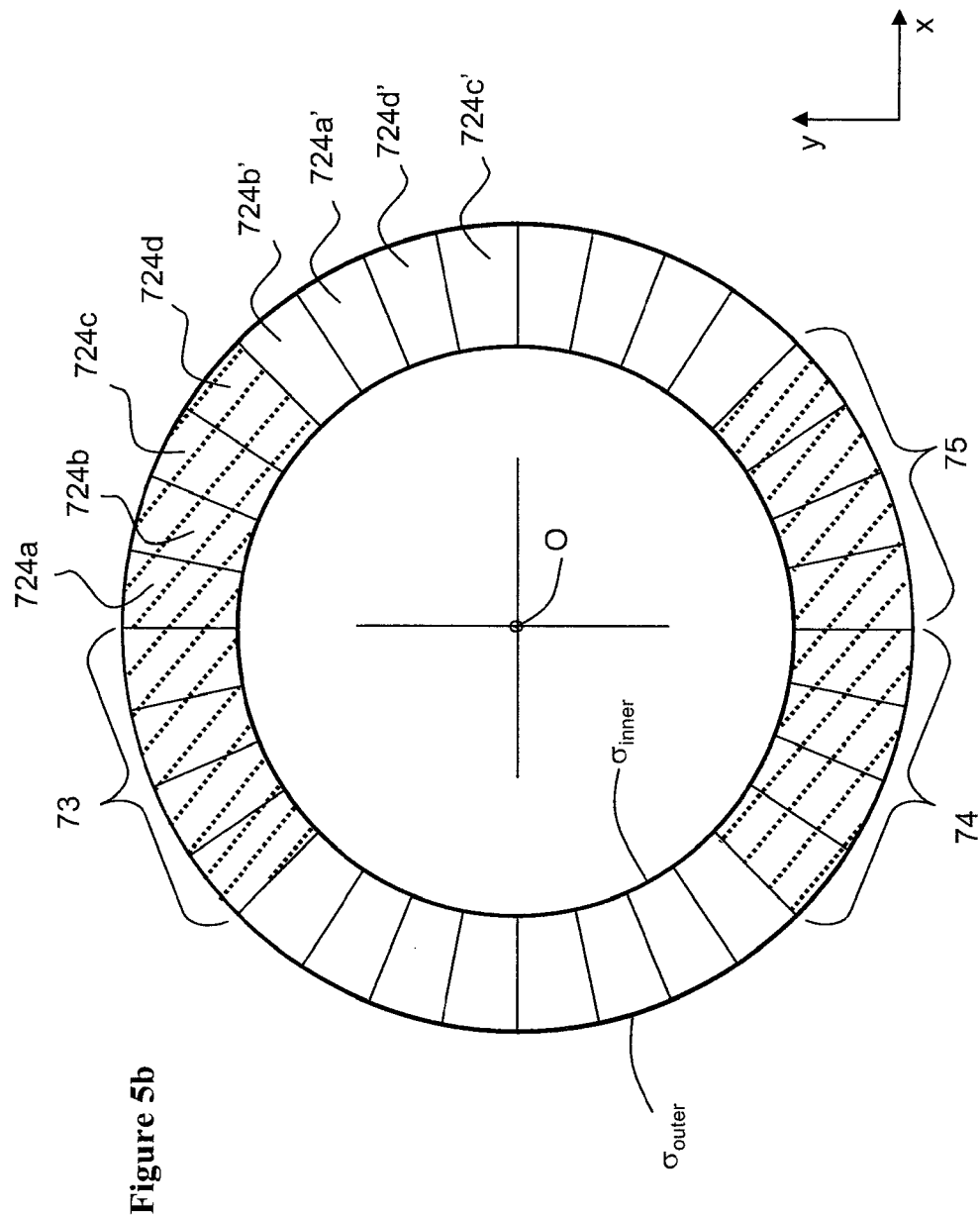
Figure 6A:
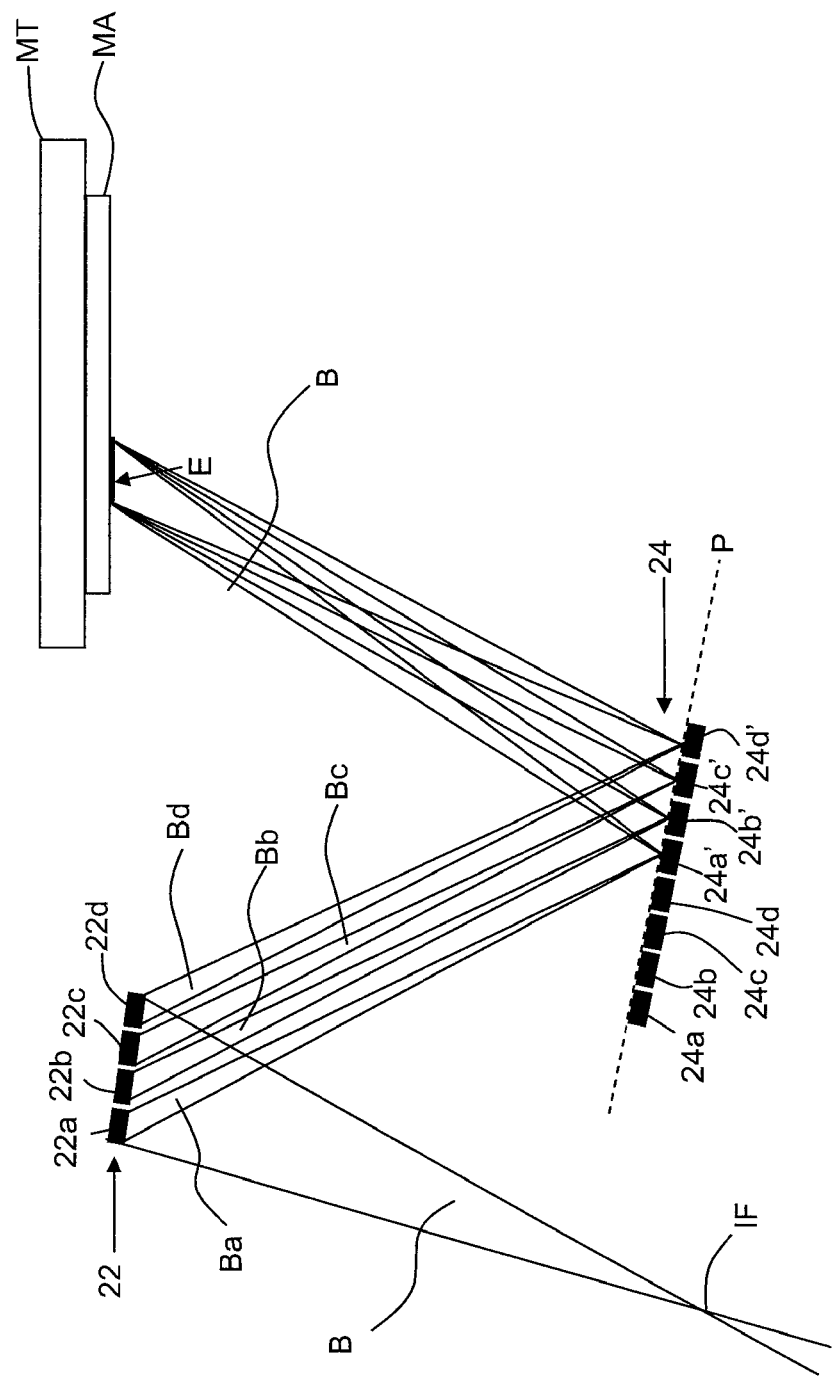
Figure 6B:
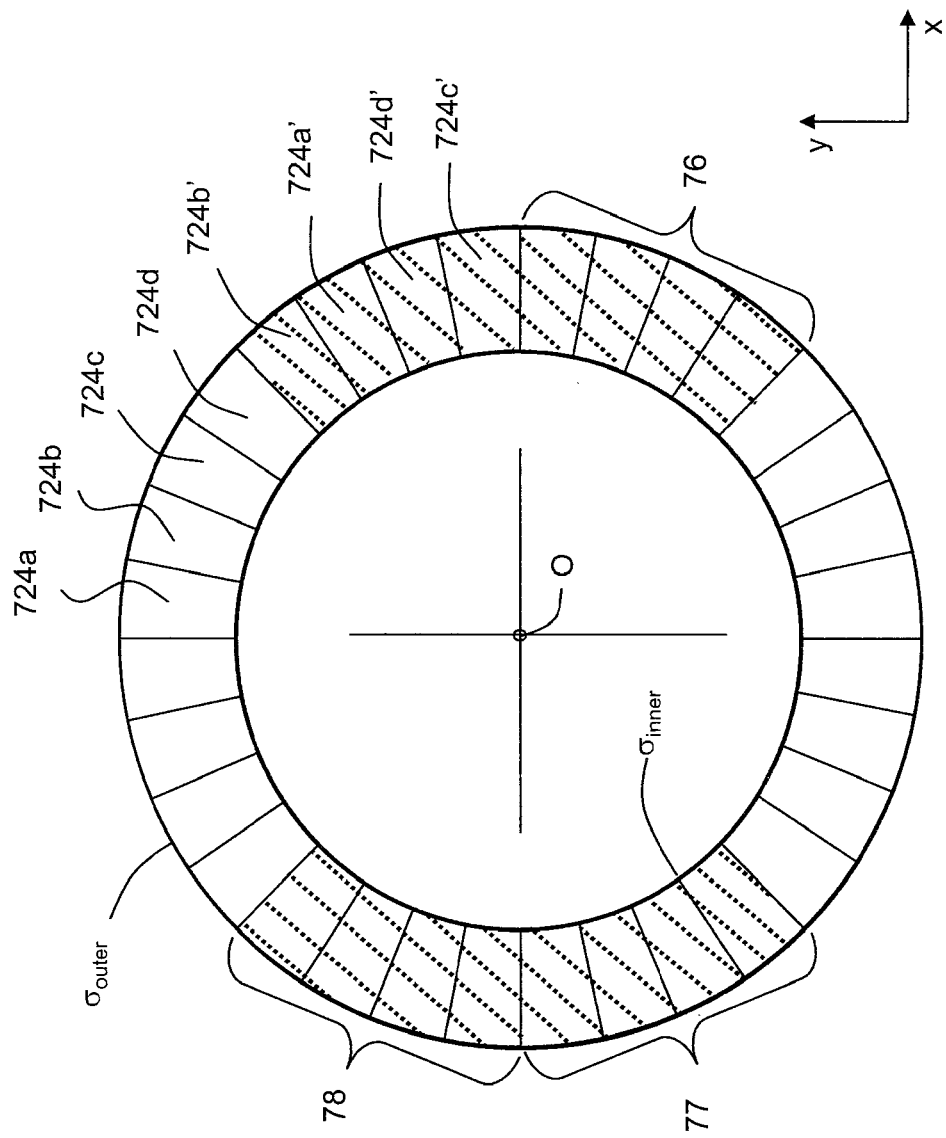

FIGS. 5 and 6 schematically illustrate the principle of redirecting radiation in order to change a spatial intensity distribution at the pupil plane P, and thereby obtain a desired illumination mode. The drawing planes of FIGS. 5b and 6b coincide with the pupil plane P shown in FIGS. 5a and 6a. Cartesian coordinates are indicated in FIGS. 5b and 6b in order to facilitate explanation of the figures. The indicated Cartesian coordinates are not intended to imply any limitation on the orientation of the spatial intensity distributions that may be obtained using the invention. The radial extent of the spatial intensity distributions is defined by $\sigma_{inner}$ (inner radial extent) and $\sigma_{outer}$ (outer radial extent). The inner and outer radial extents may be circular, or may have some other shape.

As explained above, the spatial intensity distribution (and hence illumination mode) of the radiation beam in the pupil plane P is determined by the orientations of the primary reflective elements such as the elements 22a-d. For example, an illumination mode may be provided and controlled by selecting and then moving each of the primary reflective elements 22a-d to either its first orientation or its second orientation as required.

In this example there are 16 primary reflective elements, only 4 of which are shown in FIGS. 5a and 6a (the primary reflective elements 22a-d). When the primary reflective elements 22a-d are in their respective first orientations, sub-beams Ba, Bb, Bc and Bd of radiation are reflected towards associated first locations 724a, 724b, 724c and 724d, as shown in FIG. 5b. These locations respectively comprise the secondary reflective elements 24a, 24b, 24c and 24d, shown in FIGS. 5a and 6a. Referring to FIG. 5b, the first locations 724a-d are at or close to the top of the figure. Other primary reflective elements (not illustrated) are also in their first orientations, and direct sub-beams of radiation to groups 73, 74, and 75 of adjacent first locations, which are at or close to the top of the figure, and at or close to the bottom of FIG. 5b. Locations which receive sub-beams of radiation are shaded using dotted lines. It can be seen from FIG. 5b that when the primary reflective elements 22a-d are in their first orientations and the other primary reflective elements (not illustrated) are also in their first orientations, a dipole illumination mode is formed in which the poles are separated in the y-direction.

When the primary reflective elements 22a-d are in their second orientations, sub-beams of radiation are reflected towards associated second locations 724a', 724b', 724c', and 724d', as shown in FIG. 6b. These locations respectively comprise the secondary reflective elements 24a', 24b', 24c' and 24d', shown in FIGS. 5a and 6a. Referring to FIG. 6b, the second locations 724a'-d' are at or close to the right hand side of the figure. The afore mentioned other primary reflective elements are also in their second orientations, and direct sub-beams of radiation to groups 76, 77, and 78 of adjacent second locations, which are at or close to the right hand side of the figure, and at or close to the left hand side of the figure. Locations which receive sub-beams of radiation are shaded using dotted lines. It can be seen from FIG. 6b that when the primary reflective elements 22a-d and the other primary reflective elements are in their second orientations, a dipole illumination mode is formed in which the poles are separated in the x-direction.

Switching from the y-direction dipole illumination mode to the x-direction dipole illumination mode includes moving each of the primary reflective elements 22a-d from the first orientation to the second orientation. Similarly, switching from the x-direction dipole illumination mode to the y-direction dipole illumination mode includes moving each of the primary reflective elements 22a-d from the second orientation to the first orientation.

Formation of other illumination modes may include moving some of the primary reflective elements 22a-d to their first orientation and some to their second orientation, as is explained further below. The first and second locations associated with each primary reflective element and the corresponding first orientation and second orientation of each primary reflective element may be chosen so as to maximise the number of useful illumination modes that can be produced.

The primary reflective elements may be moved between first orientations and second orientations by rotating them about predetermined axes. The primary reflective elements may be moved using actuators.

One or more primary reflective elements may be configured to be driven to rotate around the same predetermined axis. One or more other primary reflective elements may be configured to be driven to rotate around other predetermined axes.

In an embodiment, a primary reflective element comprises an actuator arranged to move the primary reflective element between the first orientation and the second orientation. The actuator may for example be a motor. The first and second orientations may be defined by end stops. A first end stop may comprise a mechanical apparatus which prevents the primary reflective element from moving beyond the first orientation. A second end stop may comprise a mechanical apparatus which prevents the primary reflective element from moving beyond the second orientation. A suitable mount for the primary reflective element, which includes end stops, is described further below.

Since movement of the primary reflective element is limited by end stops, the primary reflective element can be accurately moved to the first orientation or the second orientation without needing to monitor the position of the primary reflective element (e.g. without needing to use position monitoring sensors and a feedback system). The primary reflective elements may be oriented sufficiently accurately that they may form illumination modes of sufficient quality to be used in lithographic projection of a pattern from a patterning device onto a substrate.

A driver signal supplied to the actuator may be a binary signal. There is no need to use a more complex signal such as a variable analogue voltage or a variable digital voltage, since the actuator only needs to move the primary reflective element to a first end stop or to a second end stop. The use of a binary (two-valued) driver signal for the actuator, rather than a more complex system, allows a more simple control system to be used than would otherwise be the case.

The apparatus described above in relation to FIGS. 5 and 6 includes 16 primary reflective elements and 32 locations on the second reflective component 24. In practice, many more primary reflective elements may be provided. However, 16 primary reflective elements is a sufficient number to allow illustration of the way in which several different illumination modes may be obtained. The following illumination modes may be obtained using 16 primary reflective elements associated with respective 32 locations on the second reflective component 24: annular, c-quad, quasar, dipole-y and dipole-x. These illumination modes are formed by configuring the 16 primary reflective elements so as to appropriately direct radiation towards a desired selection of 16 of the 32 associated locations at the pupil plane of the illumination system. It is appreciated that the locations on the second reflective component 24 can effectively be specified and indicated as locations at the pupil plane of the illumination system, since the reflective surfaces of the pupil facet mirrors of the second reflective component 24 are disposed at or proximate to the pupil plane. For the sake of simplicity, no distinction is made hereinafter between a "location" on the second reflective component and a "location" at the pupil plane of the illumination system.

Figure 7:
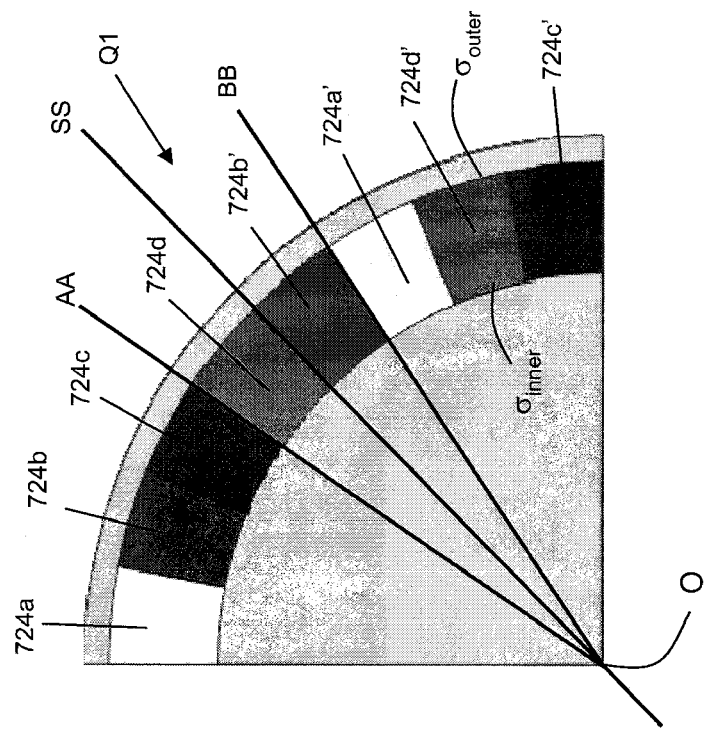
FIG. 7 depicts a first quadrant of a pupil plane.

FIG. 7 depicts a first quadrant Q1 of a pupil plane in an illumination system comprising a number of locations arranged in an annular shape circumferentially around an optical axis O intersecting the pupil plane. The illumination system is configured to produce the five different desired illumination modes. The locations 724a-d, 724a'-d' of the quadrant may receive radiation sub-beams Ba, Bb, Bc and Bd from the respective first reflective elements 22a-d. An inner radial extent of the illumination locations is labelled as $\sigma_{inner}$. An outer radial extent of the illumination locations is labelled as $\sigma_{outer}$. For simplicity, in FIG. 7 it is assumed that each location can be associated with just one secondary reflective element. In FIG. 7, the locations 724a-d, 724a'-d' are associated with the secondary reflective elements 24a-d, and the secondary reflective elements 24a'-d', respectively.

It is appreciated, however, that alternatively a plurality of secondary reflective elements may be associated with each location. For example between 10 and 20 secondary reflective elements may be provided at each location. Where this is the case, the number of primary reflective elements scales accordingly. For example, if there are 10 secondary reflective elements at a given illumination location, then there are 10 primary reflective elements arranged to direct radiation to that location (each of the primary reflective elements being arranged to direct radiation to a different secondary reflective element within the location). In the following description, where the term 'primary reflective element' is used, this may encompass a plurality of primary reflective elements which are configured to move in unison.

The relative surface area of illumination locations across the pupil plane, i.e., the surface area of the constituent locations normalized by the pupil area corresponding to the numerical aperture of the projection lens, amounts to $(\sigma_{outer}^2 - \sigma_{inner}^2)/2$. Thus, the etendue ratio X which is defined as the inverse of the used pupil area follows as $X = 2/(\sigma_{outer}^2 - \sigma_{inner}^2)$.

In the quadrant Q1 depicted in FIG. 7, there are 8 locations including the respective 8 secondary reflective devices 24a-d, 24a'-d' (corresponding with 32 locations across the entire pupil plane). Each location is sized and shaped to be illuminated by a sub-beam of radiation reflected by a primary reflective element. Each primary reflective element is configured so as to separately illuminate two different locations from different parts of the same quadrant. More specifically, each primary reflective element is configured to move between a first orientation and a second orientation so as to direct radiation and thereby illuminate either a first associated location or a second associated location in the same quadrant, and hence to irradiate either a first associated secondary reflective element or a second associated secondary reflective element.

Although pairs of locations 724a,a', 724b,b', 724c,c' and 724d,d' are provided in the same quadrant Q1 in FIG. 7, it is not necessary that this is the case. For example, a first location may be provided in one quadrant, and the corresponding second location may be provided in a different quadrant. If the separation between the first and second locations of a pair of locations is increased, then the amount of rotation required by the primary reflective element in order to direct a radiation sub-beam to those locations will also increase. The positions of the locations may be selected such that the required rotation of the primary reflective elements is minimised, or that none of the primary reflective elements is required to rotate by more than a predetermined maximum rotation. The positions of the locations may be such that a desired set of illumination modes may be obtained (for example as explained further below in relation to FIG. 8).

A first primary reflective element 22a (see FIGS. 5 and 6) is configured to illuminate a first associated location 724a of the quadrant Q1 when orientated in a first orientation, and a second associated location 724a' of the quadrant when orientated in a second orientation. A second primary reflective element 22b is configured to illuminate a first associated location 724b when orientated in a first orientation and a second associated location 724b' when orientated in a second orientation. A third primary reflective element 22c is configured to illuminate a first associated location 724c when orientated in a first orientation and a second associated location 724c' when orientated in a second orientation. A fourth primary reflective element 22d is configured to illuminate a first associated location 724d when orientated in a first orientation and a second associated location 724d' when orientated in a second orientation.

An equivalent arrangement of the locations and associated primary reflective elements may apply for other quadrants (not illustrated).

Each primary reflective element may be moved between the first orientation and second orientation by rotating it about a predetermined axis. A plurality of primary reflective elements may be configured and arranged to be rotatable about the same axis. For example, pairs of primary reflective elements associated with pairs of adjacent locations in the same quadrant of the pupil plane may be configured so as to rotate about the same axis. In the illustrated example, the first and second primary reflective elements 22a, 22b associated with the pair of adjacent locations 724a and 724b, are configured to rotate about a first axis AA, and the third and fourth primary reflective elements 22c, 22d associated with the pair of adjacent locations 724c and 724d, are configured to rotate about a second axis BB. The first axis AA is arranged at 56.25° with respect to the x-axis in quadrant Q1, and the second axis BB is arranged at 33.75° with respect to the x-axis in quadrant Q1. Although the first and second axes AA, BB are shown in the plane of FIG. 7, this is for ease of illustration only. The axes are at or near the plane of the first reflective component 22, and more specifically at or near a plane containing pivot points of pairs of primary reflective elements 22a,b and 22c,d. The first and second axes AA, BB pass through an optical axis O of the illumination system.

Additionally or alternatively, primary reflective elements associated with corresponding locations in opposing quadrants of the pupil plane may be configured to rotate about the same axis. For example, primary reflective elements 22a,b associated with the first quadrant Q1 and corresponding primary reflective elements associated with a third quadrant may be configured to rotate about the first axis AA. Likewise, primary reflective elements 22c,d associated with the first quadrant Q1 and corresponding primary reflective elements associated with the third quadrant may be configured to rotate about the second axis BB.

Primary reflective elements associated with a second quadrant, and primary reflective elements associated with a fourth quadrant, may be rotated about a third axis (e.g. arranged at 123.75° with respect to the x axis). In addition, primary reflective elements associated with the second quadrant and primary reflective elements associated with the fourth quadrant may be rotated about a fourth axis (e.g. arranged at 146.25° with respect to the x axis). Neither of these quadrants are shown in FIG. 7.

The primary reflective elements may be configured to rotate in the same direction or opposite directions about same axis.

When primary reflective elements are grouped together to rotate about the same axis, and to rotate in the same direction, an actuator arranged to move the primary reflective elements between their first and second orientations may be simplified. For example, an actuator associated with primary reflective elements that are grouped to rotate about the same axis may be arranged to move those primary reflective elements in unison. Thus, in an embodiment in which there are four predetermined axes of rotation, there may be four actuators.

FIG. 8 shows how five different illumination modes may be formed at the pupil plane of the illumination system, using the described apparatus (i.e. using 16 primary reflective elements and 4 axes of rotation). The illumination modes are as follows: annular illumination mode (FIG. 8a), dipole-x illumination mode (FIG. 8b), dipole-y illumination mode (FIG. 8c), quasar illumination mode (FIG. 8d) and c-quad illumination mode (FIG. 8e).

Figure 8A:
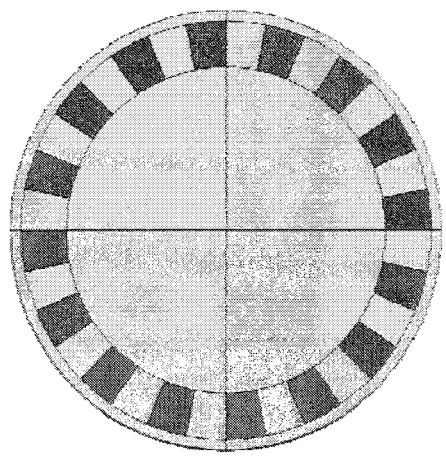
FIG. 8 depicts five illumination modes obtainable using an embodiment of the invention.

To produce the annular illumination mode, as shown in FIG. 8a, the primary reflective elements 22a-d associated with the first quadrant are oriented such that locations 724b, 724d, 724a' and 724c' are illuminated. This is achieved by rotating the first primary reflective element 22a around the first axis AA to its second orientation, rotating the second primary reflective element 22b around the first axis AA to its first orientation, rotating the third primary reflective element 22c around the second axis BB to its second orientation, and rotating the fourth primary reflective element 22d around the second axis BB to its first orientation. The primary reflective elements associated with the locations of the second, third and fourth quadrants are similarly orientated.

Figure 8B:
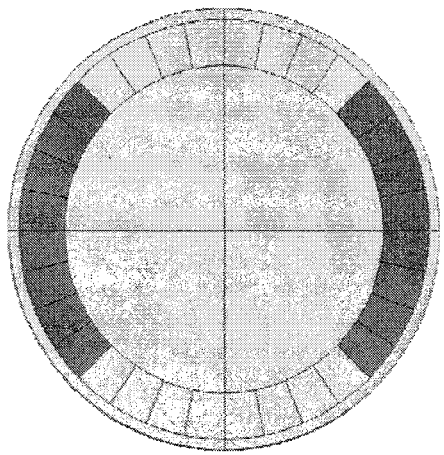

To produce a dipole-x illumination mode, as shown in FIG. 8b (see also FIG. 6b), the primary reflective elements associated with the first quadrant are orientated such that locations 724b', 724a', 724d' and 724c' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its second orientation, and rotating the fourth primary reflective element 22d around the second axis BB to its second orientation. The primary reflective elements associated with the locations of the second, third and fourth quadrants are similarly orientated.

Figure 8C:
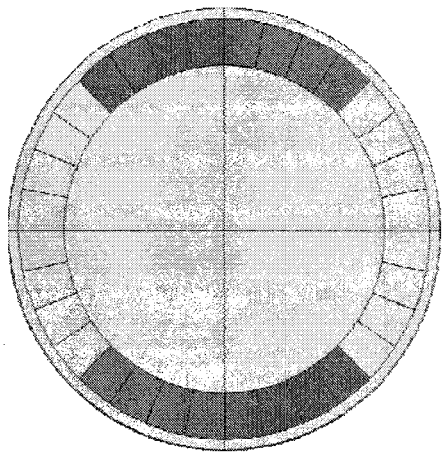

To produce a dipole-y illumination mode, as shown in FIG. 8c (see also FIG. 5b), the primary reflective elements associated with the first quadrant are orientated such that locations 724a, 724b, 724c and 724d are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its first orientation, and rotating the fourth primary reflective element 22d around the second axis BB to its first orientation. The primary reflective elements associated with the locations of the second, third and fourth quadrants are similarly orientated.

Figure 8D:
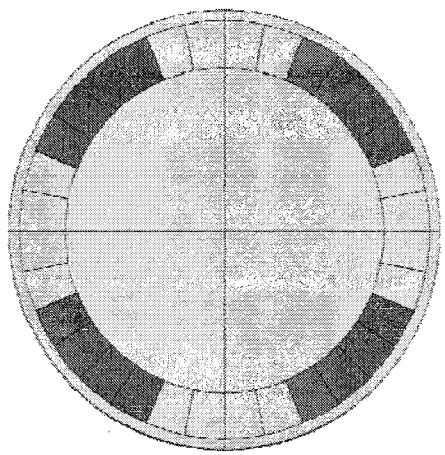

To produce a quasar illumination mode, as shown in FIG. 8d, the primary reflective elements associated with the first quadrant are orientated such that locations 724c, 724d, 724b' and 724a' are illuminated. This is achieved by rotating the first primary reflective element 22a around the first axis AA to its second orientation, rotating the second primary reflective element 22b around the first axis AA to its second orientation, rotating the third primary reflective element 22c around the second axis BB to its first orientation, and rotating the fourth primary reflective element 22d around the second axis BB to its first orientation. The primary reflective elements associated with the locations of the second, third and fourth quadrants are similarly orientated.

Figure 8E:
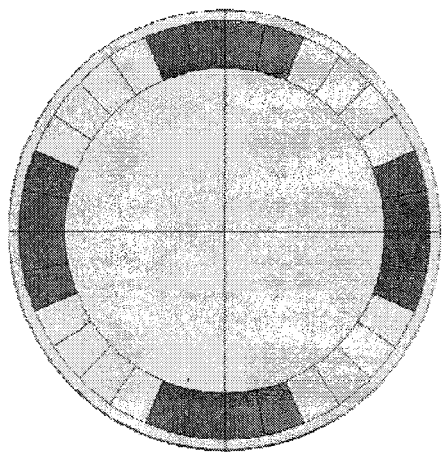

To produce a c-quad illumination mode, as shown in FIG. 8e, the primary reflective elements associated with the first quadrant are oriented such that locations 724a, 724b, 724d' and 724c' are illuminated. This is achieved by rotating the first primary reflective element 22a around the first axis AA to its first orientation, rotating the second primary reflective element 22b around the first axis AA to its first orientation, rotating the third primary reflective element 22c around the second axis BB to its second orientation and rotating the fourth primary reflective element 22d around the second axis BB to its second orientation. The primary reflective elements associated with the locations of the second, third and fourth quadrants are similarly orientated. In any of the above examples it is appreciated that illumination of a location (on the secondary reflective component) includes directing a sub beam of radiation to the corresponding secondary reflective element.

In the above description of the illumination modes shown in FIG. 8, it has been mentioned that the primary reflective elements associated with the locations of the second, third and fourth quadrants are orientated similarly to the first quadrant. The following explains the manner in which this is done. It can be seen from FIG. 8 that the dipole, quasar and c-quad modes are symmetric about the x and y axes. The annular mode of FIG. 8a however is not symmetric about the x and y axes, although it is rotationally symmetric (for rotations of 90° or multiples thereof).

According to an aspect of the invention it is appreciated that, when desired illumination modes do not share a same symmetry, the positions of the locations may be arranged such that each pair of locations has an associated pair of locations, and the two pairs are symmetric about a line SS which bisects the quadrant (see FIG. 7). For example, the first pair of locations 24a,a' is associated with the third pair of locations 24c,c'. These two pairs are symmetric about the line SS. The second pair of locations 24b,b' is associated with the fourth pair of locations 24d,d'. These two pairs are also symmetric about the line SS. The same constraint is applied to the other quadrants.

The second quadrant is a mirror image of the first quadrant. The third and fourth quadrants are mirror images of the first and second quadrants. Positioning the locations in this manner allows all of the illumination modes shown in FIG. 8 to be achieved. When any of the illumination modes shown in FIGS. 8b-d are to be produced, the orientations of corresponding primary reflective elements for each quadrant are the same. When the annular mode of FIG. 8a is to be produced, the orientations of the primary reflective elements for the first and third quadrants are opposite to those applied to the primary reflective elements for the second and fourth quadrants.

Figure 9:
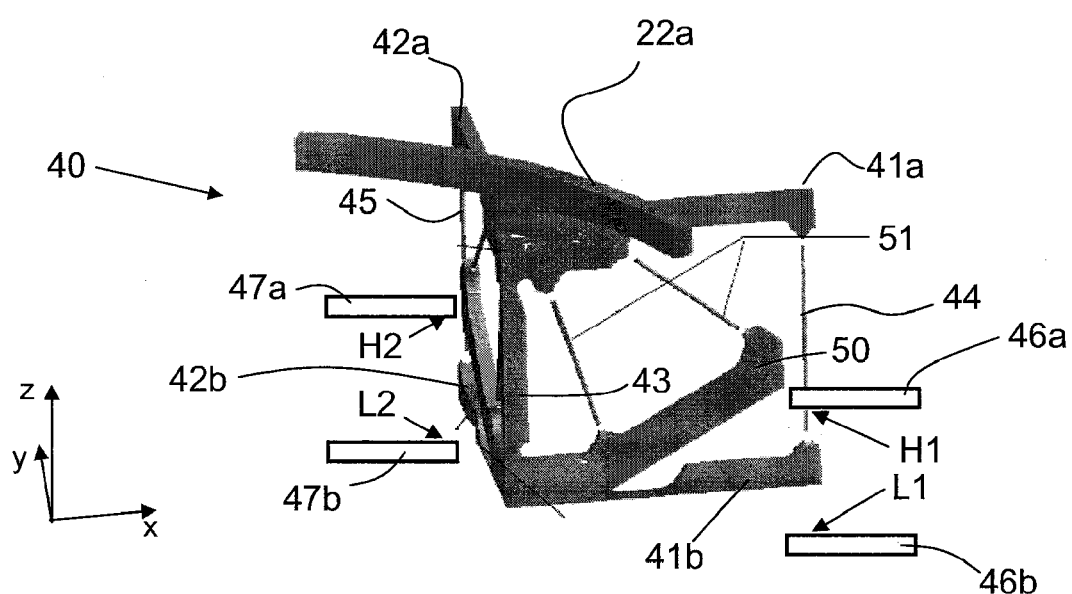
FIG. 9 depicts a mounting for a reflective element.

The primary reflective elements may be provided on mountings which allow for rotation about two axes. A mounting 40 which may be used is illustrated in FIG. 9. Cartesian coordinates are shown in FIG. 9 in order to assist in describing the mounting. A primary reflective element 22a is held on the mounting 40. The mounting 40 comprises two lever arms 41a, 41b extending in the x-direction, and two lever arms 42a, 42b extending in the y-direction. A pillar 43 extends in the z-direction and connects inner ends of the lever arms 41a,b, 42a,b together via leaf springs. Outer ends of the first pair of lever arms 41a,b are connected by a first rod 44 which maintains a constant separation between the outer ends. Outer ends of the second pair of lever arms 42a,b are connected by a second rod 45 which maintains a constant separation between the outer ends.

The first pair of lever arms 41a,b is configured to rotate the primary reflective element 22a about a first axis. End stops 46a,b limit the range of movement of the first pair of lever arms 41a,b. The end stops 46a,b establish two predetermined positions between which the lowermost lever arm 41b may move. The two predetermined positions are a high position (referred to as H1) and a low position (referred to as L1). When the lowermost lever arm 41b is in the high position H1, it is in contact with the upper end stop 46a. When the lowermost lever arm 41b is in the low position L1, it is contact with the lower end stop 46b.

The connection provided by the first rod 44 between the uppermost lever arm 41a and the lowermost lever arm 41b links movement of the uppermost and lowermost lever arms together. Movement of the uppermost lever arm 41a is therefore limited by the end stops 46a,b. Since the primary reflective element 22a is connected to the uppermost lever arm 41a, this means that rotation of the primary reflective element 22a about the first axis is limited by the end stops 46a,b. The rotation of the primary reflective element 22a about the first axis is thus limited to an orientation in which the lowermost lever arm 41b is in contact with upper low end stop 46a, and an orientation in which the lowermost lever arm 41b is in contact with the lower end stop 46b.

The second pair of lever arms 42a,b is configured to rotate the primary reflective element 22a about a second axis which is orthogonal to the first axis. End stops 47a, 47b are used to limit the movement of the second pair of lever arms 42a,b.

The second pair of lever arms move between two a high position (H1) and a lower position (L1). The rotation of the primary reflective element 22a about the second axis is thus limited to an orientation in which the lowermost lever arm 42b is in contact with upper low end stop 47a, and an orientation in which the lowermost lever arm 42b is in contact with the lower end stop 47b.

If both pairs of lever arms 41a,b, 42a,b are moved in the same direction to the same extent, then a rotation of the primary reflective element 22a about the x-axis is obtained. If the pairs of lever arms 41a,b, 42a,b are moved in opposite directions, to the same extent, then a rotation of the primary reflective element 22a about the y-axis is obtained.

Flexible rods 50 extend from a rigid arm 51 which lies in a plane defined by the first pair of lever arms 41a,b. Equivalent flexible rods (not labelled) extend from a rigid arm (not labelled) which lies in a plane defined by the second pair of lever arms 42a,b. The flexible rods are used to define the pivot point of the mounting. The pivot point is located where the flexible rods cross.

The configuration of the mounting 40 allows four possible first orientations of the primary reflective element 22a, which correspond to four possible first positions of the pairs of lever arms 41a,b, 42a,b. The configuration of the mounting 40 similarly allows four corresponding second orientations of the primary reflective element 22a, which correspond to four possible second positions of the pairs of lever arms 41a,b, 42a,b. The orientations are as follows:
First Orientation: H1, H2 H1, L2 L1, H2 L1, L2
Second Orientation: L1, L2 L1, H2 H1, L2 H1, H2

In each instance, a particular second orientation corresponds with only one first orientation. Thus, the primary reflective element 22a may only move between two orientations. An actuator (not illustrated) may be used to select a particular combination of first and second orientations from the above set. The actuator may for example be configured to move the pairs of lever arms 41a,b, 42a,b between the H1, H2 positions and the L1, L2 positions. In the context of FIG. 9, this may be achieved by the actuator moving both pairs of lever arms 41a,b, 42a,b together in the same direction. Alternatively, the actuator may be configured to move the pairs of lever arms between the H1,L2 positions and the L1, H2 positions. In the context of FIG. 9, this may be achieved by the actuator moving the pairs of lever arms in opposite directions.

These exact locations of the first and second positions of the pairs of lever arms 41a,b, 42a,b (and hence the orientations of the primary reflective element 22a) are determined by the positions of the end stops 46a,b, 47a,b. For example, moving the upper end stops 46a, 47a towards the lower end stops 46b, 47b will change the location of the pairs of lever arms 41a,b, 42a,b when they are in the H1, H2 position (and hence change the orientation of the primary reflective element 22a). Thus, the end stops allow the first and second orientations of the primary reflective element to be accurately determined. The end stops also allow the axis of rotation of the primary reflected element 22a to be accurately selected.

The locations illuminated at the pupil plane P (see FIGS. 3-6) will vary according to the orientation of the primary reflective element 22a. Thus, moving the primary reflective element 22a between the first orientation and the second orientation allows different illumination modes to be selected, in the manner described further above.

If each of the four primary reflective elements 22a-d are rotated using the mounting of FIG. 9, then the positions of the lever arms may be as follows:

| | Element | | | |
|---|---|---|---|---|
| | 22a | 22b | 22c | 22d |
| Annular Mode | HL | LH | HL | LH |
| x-Dipole Mode | HL | HL | HL | HL |
| y-Dipole Mode | LH | LH | LH | LH |
| Quasar Mode | LH | LH | HL | HL |
| C-Quad Mode | HL | HL | LH | LH |

It is possible to adjust the axis of rotation of the first primary reflective element 22a by adjusting the positions of the end stops 46a,b, 47a,b, 50. The end stops may be positioned for example such that the axis of rotation of the first primary reflective element corresponds with axis AA of FIG. 7. Similarly, the end stops may be positioned for example such that the axis of rotation of the third primary reflective element 22c corresponds with axis BB of FIG. 7.

The lever arms 41a,b, 42a,b may be driven by an actuator (not shown). The actuator may for example be a motor. Each lever arm pair 41a,b, 42a,b may be driven by a different dedicated actuator. Thus, eight actuators may be used to drive lever arms to rotate the four primary reflective elements 22a-d associated with the locations 724a-d, 724a'-d' of quadrant Q1 in FIG. 7.

Alternatively, both lever arm pairs 41a,b, 42a,b may be driven by a single actuator, which may for example be configured to provide both direct and inverted motion. Where this is the case, four motors may be used to drive the lever arms to rotate the four primary reflective elements 22a-d associated with the locations 724a-d, 724a'-d' of quadrant Q1 in FIG. 7.

A plurality of primary reflective elements may be used instead of the first primary reflective element 22a. Where this is the case, the plurality of primary reflective elements may each be provided on a mounting 40. The mountings 40 may be driven by actuators which are arranged such that the plurality of primary reflective elements move in unison. The same applies to other primary reflective elements 22b-d.

The actuator may be more simple than actuators used in the prior art because the actuator is only required to drive the primary reflective element to two positions. Actuators in prior art systems drive reflective elements to a larger number of positions, and therefore require more accurate control. Since the actuator is only required to drive the primary reflective element to two positions, sensing systems are not needed to determine the orientation of the primary reflective element. Furthermore, binary signals may be used to control the positions of the reflective elements, rather than using multi-valued (analogue) signals.

The actuator may for example be a piezo-electric actuator, electrostatic actuator, a bi-metal actuator, or a motor.

The mounting shown in FIG. 9 is merely an example. Other suitable mountings may be used.

It may be possible to arrange the primary reflective elements more closely together than in conventional prior art arrays of reflective elements. This is because each primary reflective element is only moved between two positions, and therefore does not require space around its perimeter which would allow it to move to other different positions. This closer arrangement of the primary reflective elements reduces loss of radiation in the lithographic apparatus. This is because spaces between the primary reflective elements into which radiation may pass are smaller.

In the above described embodiment, the locations which are illuminated by radiation sub-beams all have the same inner radial extent ($\sigma_{inner}$) and outer radial extent ($\sigma_{outer}$) (e.g. they all lie in a single ring). This is illustrated for example in FIG. 7, where all of the locations 724a-d, 724a'-d' of quadrant Q1 are shown with the same inner and outer radial extents. In addition, the axes of rotation of the primary reflective elements all pass through the origin of the quadrant (i.e. the optical axis of the illumination system).

Figure 10:
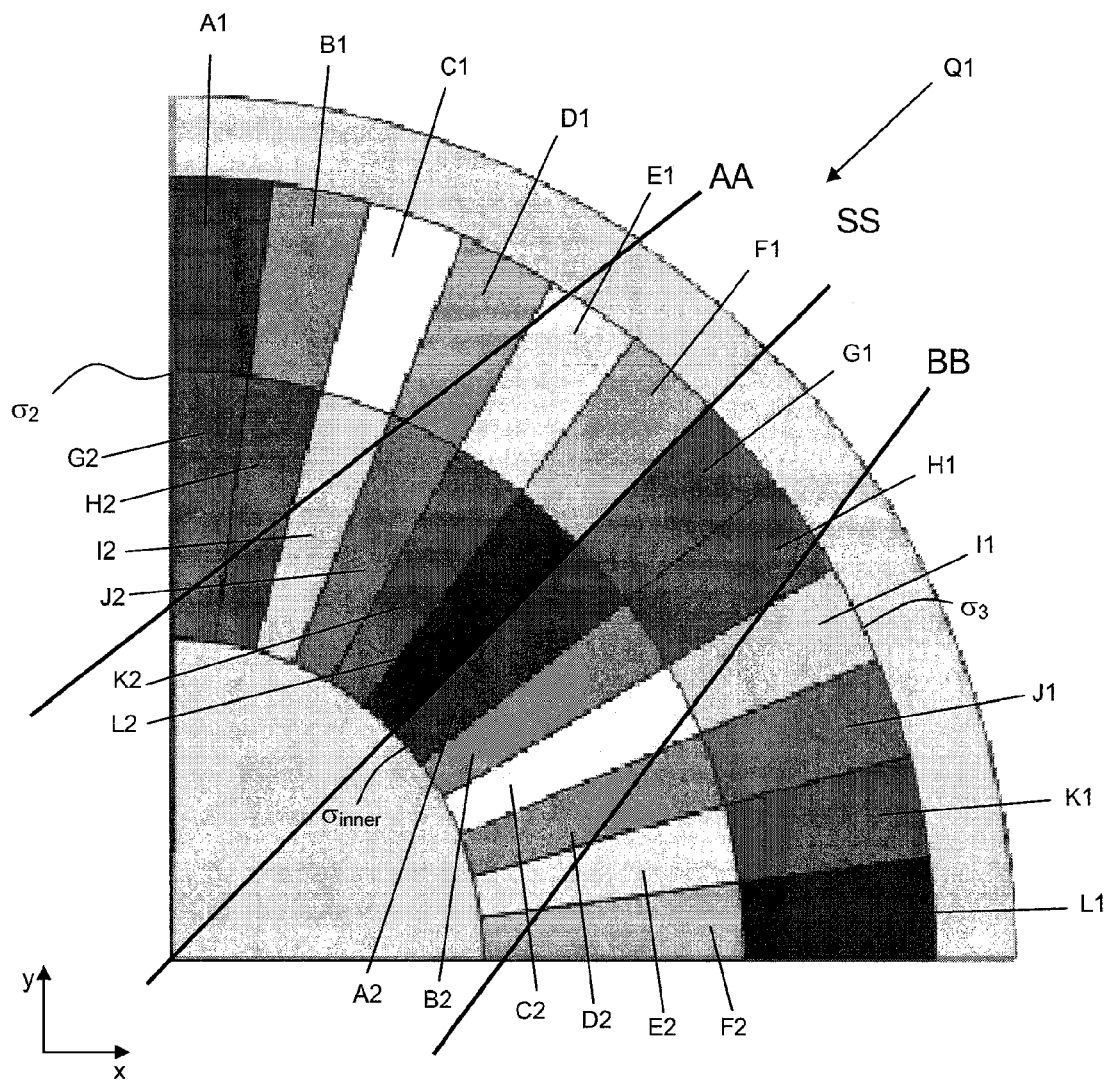
FIG. 10 depicts a first quadrant of a pupil plane in an alternative embodiment of the invention.

In an alternative embodiment, the locations which are illuminated by radiation sub-beams may for example be provided as being arranged in a disk shaped area and a ring shaped area, both areas centred with respect to the optical axis of the illumination system, the ring shaped area and lying adjacent to the disk shaped area. FIG. 10 depicts a first quadrant of a pupil plane Q1 with this arrangement of locations. There are 24 locations A1, A2 to L1, L2 in the quadrant Q1 (96 locations across the entire pupil plane). 12 primary reflective elements A to L (not shown) are configured to illuminate the associated 24 locations of the quadrant Q1 (48 primary reflective elements are configured to illuminate all of the locations).

A plurality of secondary reflective elements may be provided at each location. For example between 10 and 20 secondary reflective elements may be provided at each location. Where this is the case, the number of primary reflective elements scales accordingly. For example, if there are 10 secondary reflective elements at a given location, then there are 10 primary reflective elements arranged to direct radiation to that location (each of the primary reflective elements being arranged to direct radiation to a different secondary reflective element). In this description, where the term 'primary reflective element' is used, this may encompass a plurality of primary reflective elements which are configured to move in unison.

The locations may be classified as an inner location group and an outer location group. Hence, any location in the inner location group is radially separated from any location in the outer location group. The locations in the inner location group are illuminated when associated primary reflective elements are in their first orientations. The locations in the outer location group are illuminated when associated primary reflective elements are arranged in their second orientations. It is appreciated that one may equally well, vice versa, associate the inner location with primary reflective elements in their second orientations and the outer location group with primary reflective elements in their first orientations.

The inner location group has an inner radial extent $\sigma_{inner}$ and an outer radial extent $\sigma_2$. The outer location group has an inner radial extent $\sigma_2$ and an outer radial extent $\sigma_3$.

The relative surface area of the locations across the pupil plane amounts to $(\sigma_3^2 - \sigma_{inner}^2)/2$. Thus, the etendue ratio X (i.e. the inverse of the relatively used pupil area) follows as $X = 2/(\sigma_3^2 - \sigma_{inner}^2)$.

Each primary reflective element is configured so as to separately illuminate two locations from different parts of the same quadrant (e.g. Q1). More specifically, each first reflective element is configured to move between a first orientation and a second orientation. When the first reflective element is in the first orientation, a radiation sub-beam is directed towards a first associated location in the outer location group. When the first reflective element is in the second orientation, the radiation sub-beam is directed towards a second associated location in the inner location group (both locations being in the same quadrant).

Referring to FIG. 3 and FIG. 10, a primary reflective element 22a may be configured to illuminate a first associated location A1 when in its first orientation, and to illuminate a second associated location A2 when in its second orientation. A different primary reflective element 22b may be configured to illuminate a first associated location B1 when in its first orientation, and a second associated location B2 when in its second orientation. Other primary reflective elements may be configured in the same way.

As in the embodiment where the locations are arranged in a ring shaped area (see FIG. 7), here too it is an aspect of the invention that desired illumination modes may not share a same symmetry, in which case the positions of the locations may be arranged such that each pair of locations has an associated pair of locations, and the two pairs are symmetric about a line SS which bisects the quadrant Q1.

For example, the first pair of locations A1, A2 is associated with a seventh pair of locations G1, G2. These two pairs are symmetric about the line SS. In a second example, the second pair of locations B1, B2 is associated with the fourth pair of locations H1, H2. These two pairs are also symmetric about the line SS. The same symmetry constraint is applied to the other pairs of locations. Furthermore, the same constraint is applied to the other quadrants.

The configuration of the locations and associated primary reflective regions may be the same for each of the quadrants of the pupil plane. For example, the second quadrant may be a mirror image of the first quadrant. The third and fourth quadrants may be mirror images of the first and second quadrants.

Each of the primary reflective elements may be moved between a first orientation and a second orientation by rotating it about a predetermined axis. Rotation may be limited by end-stops. In order to radiate an location in the outer illumination group and an location in the inner illumination group, it may be the case that the predetermined axis does not pass through the optical axis of the illumination system.

Referring to FIG. 3 and FIG. 10, a first primary reflective element 22a which illuminates first associated locations A1, A2 may rotate about a first axis AA. A second primary reflective element 22b which illuminates second associated locations L1, L2 may rotate about a second axis BB. Other primary reflective elements may rotate about other axes (not illustrated). In total there are 12 axes of rotation for the first quadrant Q1. Rotation axes for the third quadrant are parallel to those for the first quadrant. There are 12 rotation axes for the second quadrant, and these are parallel to the rotation axes for the fourth quadrant. In total therefore there are 24 rotation axes.

Primary reflective elements associated with corresponding locations in opposing quadrants of the pupil plane may be configured to rotate about the same axis. In the example depicted in FIG. 10, there may for example be 12 predetermined axes of rotation in total. This comprises 6 axes extending across Q1 and Q3, and 6 axes extending across Q2 and Q4.

The primary reflective elements may be used to produce seven different illumination modes. The illumination modes are shown in FIG. 11. The illumination modes are: first, second and third annular modes, a second disk mode, dipole modes and quadrupole modes.

To produce the first annular mode, shown in FIG. 11a, the primary reflective elements associated with the quadrant Q1 are orientated such that locations A1 to L1 are illuminated. This is achieved by rotating every primary reflective element about its predetermined axis to its first orientation. The primary reflective elements associated with the locations of the second, third and fourth quadrants are similarly orientated.

To produce the second annular illumination mode, shown in FIG. 11b, the primary reflective elements associated with the quadrant Q1 are orientated such that locations A2 to L2 are illuminated. This is achieved by rotating every primary reflective element about its predetermined axis to its second orientation. The primary reflective elements associated with the locations of the second, third and fourth quadrants are similarly orientated. If the inner radial extent $\sigma_{inner}$ were to be zero, rather than a finite value, then this mode would be a disk mode rather than an annular mode.

To produce the third annular illumination mode, as shown in FIG. 11c, the primary reflective elements associated with quadrant Q1 are orientated such that locations A2, B1, C2, D1, E2, F1, G2, H1, I2, J1, K2 and L1 are illuminated. This is achieved by rotating those primary reflective elements associated with locations A, C, E, G, I and K about predetermined axes to their second orientations, and rotating primary reflective elements associated with locations B, D, F, H, J and L about predetermined axes to their first orientations. The primary reflective elements associated with the locations of the second, third and fourth quadrants are similarly orientated.

To produce an x-dipole mode illumination mode, as shown in FIG. 11d, the primary reflective elements associated with quadrant Q1 are orientated such that locations A2 to F2 and G1 to L1 are illuminated. This is achieved by rotating primary first reflective elements associated with locations A to F around predetermined axes to their second orientations, and rotating primary reflective elements associated with locations G to L around predetermined axes to their first orientations. The primary reflective elements associated with the locations of the second, third and fourth quadrants are similarly orientated.

To produce a y-dipole illumination mode, as shown in FIG. 11e, the primary reflective elements associated with quadrant Q1 are orientated such that locations A1 to F1 and G2 to L2 are illuminated. This is achieved by rotating primary reflective elements associated with locations A to F around predetermined axes to their first orientations, and rotating primary reflective elements associated with locations G to L around predetermined axes to their second orientations. The primary reflective elements associated with the locations of the second, third and fourth quadrants are similarly orientated.

To produce a quadrupole illumination mode, as shown in FIG. 11f, the first reflective elements associated with quadrant Q1 are orientated such that locations D1 to I1, J2 to L2 and A2 to C2 are illuminated. This is achieved by rotating primary reflective elements associated with locations D to I around predetermined axes to their first orientations, and rotating primary reflective elements associated with locations J to L and A to C about predetermined axes to their second orientations. The primary reflective elements associated with the locations of the second, third and fourth quadrants are similarly orientated.

To produce an alternative quadrupole illumination mode, as shown in FIG. 11g, the primary reflective elements associated with the quadrant Q1 are orientated such that locations A1 to C1, G2 to I2, J1 to L1 and D2 to F2 are illuminated. This is achieved by rotating primary reflective elements associated with locations A to C and J to L around predetermined axes to their first orientations, and rotating primary reflective elements associated with locations G to I and D to F around predetermined axes to their second orientations. The primary reflective elements associated with the locations of the second, third and fourth quadrants are similarly orientated.

Figure 12:
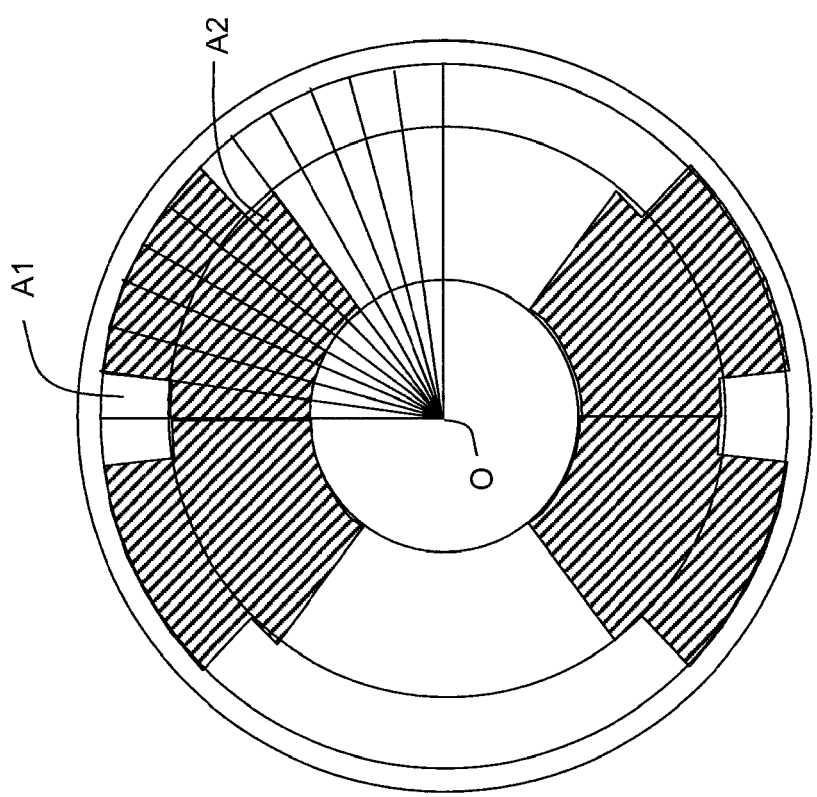
FIG. 12 depicts an approximate dipole illumination mode obtainable using an embodiment of the invention.

The primary reflective elements may also be oriented to produce other desired illumination modes at the pupil plane. For example, according to an aspect of the invention, any illumination mode as shown in FIG. 11 can be modified to provide an approximation of the original illumination mode by moving a limited number of primary reflective elements irradiating locations in a quadrant into the other one of its two orientations. Such an adjustment of an illumination mode allows for providing "approximate" variants of standard illumination modes. For example, the dipole illumination mode shown in FIG. 11e can be changed into the approximate dipole illumination mode as shown in FIG. 12, by switching the field facet which irradites associated location A1 to its position wherein it irradiates its associated location A2, as illustrated in FIG. 10 (and FIG. 12), and by applying similar switchings to corresponding primary reflective elements associated with locations in the other three quadrants. The use of approximate illumination modes can provide an improved lithographic process window, depending on the pattern to be imaged.

Although described embodiments of the invention have referred to 16 primary reflective elements or 48 primary reflective elements, any suitable number of primary reflective elements may be used.

The above description of the invention has referred to a reflective illumination system (e.g. comprising part of an EUV lithographic apparatus). However, the invention may be provided in an illumination system which comprises refractive elements. The invention may for example be provided in a DUV lithographic apparatus. Refractive optical components may be provided in the illumination system pupil plane instead of or in addition to reflective optical components.

While specific embodiments of the invention have been described above, it will be appreciated that the invention may be practiced otherwise than as described. The description is not intended to limit the invention.

The preferred features of the invention are applicable to all aspects of the invention and may be used in any combination.

The invention claimed is:

1. An illumination system having a plurality of reflective elements, the reflective elements being movable between different orientations which direct radiation towards different locations in a pupil plane, thereby forming different illumination modes, wherein each reflective element is moveable between
   a respective first orientation which directs radiation towards a first associated location at the pupil plane, and
   a respective second orientation which directs radiation towards a second associated location at the pupil plane,
   the respective first orientation and the respective second orientation of the reflective element being defined by end stops, wherein the end stops have adjustable positions.

2. The illumination system of claim 1, wherein each reflective element is mounted on a respective mounting which is moveable between
   a respective first position which corresponds to the first orientation of the reflective element, and
   a respective second position which correspond to the second orientation of the reflective element,
   and wherein the end stops define the first and second positions of the mounting and thereby define the respective first and respective second orientations of the reflective element.

3. The illumination system of claim 2, wherein the mounting comprises one or more arms which are moveable between the first position and the second position.

4. The illumination system of claim 2, wherein the mounting is configured such that an orientation of an axis of rotation of the reflective element may be adjusted by adjusting the position of one or more of the end stops.

5. The illumination system of claim 2, wherein the mounting is connected to an actuator which is configured to move the mounting between the first position and the second position.

6. The illumination system of claim 5, wherein the actuator is connected to a plurality of respective mountings, and is configured to simultaneously move the plurality of respective mountings between the respective first and second positions.

7. The illumination system of claim 5, wherein the actuator is a piezo-electric actuator, electrostatic actuator, a bi-metal actuator, or a motor.

8. The illumination system of claim 1, wherein the plurality of the reflective elements comprises a group of reflective elements constructed and arranged to be rotatable about a same axis.

9. The illumination system of claim 8, wherein the plurality of the reflective elements comprises a further group of reflective elements constructed and arranged to be rotatable about a further same axis and wherein the axis and the further axis pass through an optical axis of the illumination system.

10. The illumination system of claim 8, wherein the plurality of the reflective elements comprises a further group of reflective elements constructed and arranged to be rotatable about a further same axis and wherein the axis and the further axis do not pass through an optical axis of the illumination system.

11. The illumination system of claim 1, wherein the illumination system comprises a further plurality of reflective elements provided in the pupil plane.

12. A lithographic apparatus comprising an illumination system having a plurality of reflective elements, the reflective elements being movable between different orientations which direct radiation towards different locations in a pupil plane, thereby forming different illumination modes, wherein each reflective element is moveable between
a respective first orientation which directs radiation towards a first associated location at the pupil plane, and
a respective second orientation which directs radiation towards a second associated location at the pupil plane, the respective first orientation and the respective second orientation of the reflective element being defined by end stops, wherein the end stops have adjustable positions.

13. A method of forming illumination modes in an illumination system, the method comprising
moving a plurality of reflective elements to respective first orientations which are defined by end stops;
directing radiation at associated first locations at a pupil plane to form a first illumination mode; then
moving at least some of the plurality of reflective elements to respective second orientations which are defined by end stops,
directing radiation at associated second locations at a pupil plane to form a second illumination mode; and
adjusting a position of at least one of the end stops corresponding to an additional illumination mode.

14. The method of claim 13, wherein the first and second illumination modes are mutually different illumination modes selected from
a conventional on axis illumination mode and an off axis illumination mode, or from
a first off axis illumination mode and a second off axis illumination mode.

15. The method of claim 13, wherein associated first and second locations in relation to a reflective element are included in a quadrant of a circular section of the pupil plane centered with respect to an optical axis of the illumination system.

16. The method of claim 15, wherein the first and second locations are radially separated from each other.

17. The method of claim 15, wherein positions of the first and second locations are associated with positions of a further first and a further second location in relation to a corresponding further reflective element, and wherein the positions of the first and second locations and the positions of the further first and further second location are symmetric with respect to a line bisecting the quadrant.

18. An illumination system including a first and a second reflective component, the first reflective component constructed and arranged to receive radiation from a radiation source and to reflect the radiation towards a second reflective component, the second reflective component constructed and arranged to function as a secondary radiation source by reflecting incident radiation towards an illumination area for a patterning device, the first reflective component having a plurality of primary reflective elements, wherein each primary reflective element is movable between
a respective first orientation in which radiation is reflected towards a first associated location at the second reflective component, and
a respective second orientation in which radiation is reflected towards a second associated location at the second reflective component, the first orientation and the second orientation of the reflective element being defined by end stops, wherein the end stops have adjustable positions.

19. The illumination system of claim 18, wherein first associated locations and second associated locations are arranged in an area at the second reflective component having an annular shape circumferentially around an optical axis.

20. The illumination system of claim 18, wherein there is provided at the second reflective component
an area having an annular shape circumferentially around an optical axis, and
an inner area enclosed by the annular shaped area, and wherein first associated locations are arranged in the inner area and second associated locations are arranged in the area having the annular shape.

21. The illumination system of claim 19, wherein the plurality of the primary reflective elements comprises a group of reflective elements constructed and arranged to be rotatable about a same axis.

22. The illumination system of claim 18, wherein the second reflective component is provided in a pupil plane of the illumination system.

23. The illumination system of claim 18, wherein the first and second associated locations comprise a first and second associated secondary reflective element respectively, the first and second associated secondary reflective elements constructed and arranged to direct a first and second sub-beam of radiation reflected by the corresponding primary reflective element when in its first and second orientation respectively, to the illumination area.

24. A lithographic apparatus comprising an illumination system including a first and a second reflective component, the first reflective component constructed and arranged to receive radiation from a radiation source and to reflect the radiation towards a second reflective component, the second reflective component constructed and arranged to function as a secondary radiation source by reflecting incident radiation towards an illumination area for a patterning device, the first reflective component having a plurality of primary reflective elements, wherein each primary reflective element is movable between
a respective first orientation in which radiation is reflected towards a first associated location at the second reflective component, and
a respective second orientation in which radiation is reflected towards a second associated location at the second reflective component, the first orientation and the second orientation of the reflective element being defined by end stops, wherein the end stops have adjustable positions.

* * * * *